US007743748B2

(12) United States Patent
Östman

(10) Patent No.: US 7,743,748 B2
(45) Date of Patent: Jun. 29, 2010

(54) METHOD OF CONTROLLING THE OPERATION OF A SOLENOID

(75) Inventor: Fredrik Östman, Turku (FI)

(73) Assignee: Wärtsilä Finland Oy, Vaasa (FI)

( * ) Notice: Subject to any disclaimer, the term of this patent is extended or adjusted under 35 U.S.C. 154(b) by 1097 days.

(21) Appl. No.: 10/555,481

(22) PCT Filed: May 6, 2004

(86) PCT No.: PCT/FI2004/050058

§ 371 (c)(1),
(2), (4) Date: Nov. 2, 2005

(87) PCT Pub. No.: WO2004/102600

PCT Pub. Date: Nov. 25, 2004

(65) Prior Publication Data

US 2007/0139047 A1 Jun. 21, 2007

(30) Foreign Application Priority Data

May 13, 2003 (FI) ................................. 20030716

(51) Int. Cl.
*H01H 47/00* (2006.01)
*G01R 31/327* (2006.01)

(52) U.S. Cl. ........................ 123/478; 123/467; 361/154

(58) Field of Classification Search ................. 123/478, 123/467, 490, 499, 500, 506; 361/152, 154, 361/146, 140

See application file for complete search history.

(56) References Cited

U.S. PATENT DOCUMENTS

| | | | | |
|---|---|---|---|---|
| 5,182,517 | A | 1/1993 | Thelen et al. | |
| 5,433,109 | A | 7/1995 | Mayer-Dick et al. | |
| 5,742,467 | A | 4/1998 | Schmitz | |
| 6,024,071 | A * | 2/2000 | Heimberg et al. | 361/154 |
| 6,167,870 | B1 * | 1/2001 | Sakasai | 123/467 |

FOREIGN PATENT DOCUMENTS

| | | |
|---|---|---|
| DE | 36 11 220 | 1/1987 |
| WO | 94/13991 | 6/1994 |

* cited by examiner

*Primary Examiner*—Hieu T Vo
(74) *Attorney, Agent, or Firm*—Chernoff, Vilhauer, McClung & Stenzel, LLP

(57) ABSTRACT

A method for controlling the operation of a solenoid (14), in which solenoid the movement of the plunger is caused by bringing electric energy to the solenoid, whereby an electric current flows through the solenoid, the method comprising the following steps.

defining a model (6) for describing the current signal of the solenoid at certain time intervals from the activation moment of the solenoid onwards, measuring the true current signal (7) of the solenoid at time intervals corresponding with the model, defining a residual signal (8), which is the remainder between the signal of the model (6) and the true current signal (7), and performing a threshold analysis (25) for the residual signal.

6 Claims, 2 Drawing Sheets

METHOD OF CONTROLLING THE OPERATION OF A SOLENOID

This is a national stage application filed under 35 USC 371 based on International Application No. PCT/FI2004/050058 filed May 6, 2004, and claims priority under 35 USC 119 of Finnish Patent Application No. 20030716 filed May 13, 2003.

TECHNICAL FIELD

The invention relates to a method of controlling the operation of a solenoid, as set forth in the preamble of claim 1, in which solenoid the movement of the plunger is caused by bringing electric energy to the solenoid, whereby an electric current flows through the solenoid.

BACKGROUND ART

A number of fuel injection systems of engines utilize solenoids for controlling the operation of injector nozzles. This can be accomplished by directly operating the valve needle or indirectly by controlling, for example, the pressure level of injector nozzle servo oil by means of the solenoid valve. In both cases the operation is always based on the movement of the plunger of the solenoid. U.S. Pat. No. 6,240,901 by the applicant discloses a system based on indirect control.

An electric current flows through the coil of the solenoid when a source of electric energy is connected thereto. This produces a magnetic field that causes the plunger of the solenoid to move. In a solenoid, the electric current changes on the basis of the position of the plunger, and the current starts to decrease for a while especially when the plunger has started to move, thereby forming a local maximum value of the current. This information can be used for controlling the operation of the solenoid, especially it be used for observing the opening moment of the injectors nozzle. This information can also be used for making sure that the plunger has started to move.

Publication WO 03/007317 A1 discloses a method of controlling a solenoid. The starting point in this publication is, however, to define the moment when the injector nozzle has fully opened. The above-mentioned local maximum value of the current also occurs as the movement of the plunger stops. In the method described in the publication, the events during the movement of the injector nozzle are ignored.

DISCLOSURE OF THE INVENTION

It is an aim of the present invention to provide a method of controlling the operation of a solenoid while minimizing the problems associated with prior art. It is an especial aim of the invention to provide a method of determining the starting point of the injection of a solenoid-controlled injector nozzle, whereby the starting point of the injection takes place reliably but simply.

The method according to the invention for controlling the operation of a solenoid, in which solenoid the movement of the plunger is caused by bringing electric energy to the solenoid, whereby an electric current flows through the solenoid, comprising the following steps.

- defining a model for describing the current signal of the solenoid at certain time intervals from the activation moment of the solenoid onwards,
- measuring the true current signal of the solenoid at time intervals corresponding with the model,
- defining a residual signal, which is the remainder between the signal of the model and the true current signal, and
- performing a threshold analysis for each residual signal.

The method according to the invention makes use of a model in which the value of the current signal of the solenoid is linearly modelled with a sequentially continuous function, the value of which is time-dependent only.

In the method, the time window for determining the model corresponds with the desired control time of the solenoid used in the method, such as retraction time. Correspondingly, the time window for defining the threshold analysis corresponds with the retraction time of the solenoid of the present method. In the threshold analysis, the deviation of the residual signal from zero value to a predetermined limit value, whereby the resulting signal can easily be used for noticing the relatively large positive deviation caused by the beginning of the movement of the plunger. Preferably the method is used for determining the beginning of the opening of the fuel injector nozzle of an engine. The solenoid controls the operation of the injector nozzle of the engine, whereby at least the point in time, in which the value of the residual signal exceeds the said limit value, is forwarded along in the control unit to be used in controlling the operation of the engine.

The present invention also relates to a fuel injection system of an internal combustion engine, the injection system comprising at least one electrically controllable injector nozzle arranged to carry out the above-mentioned method.

DESCRIPTION OF DRAWINGS

In the following the invention is described by way of example and with reference to the appended drawings, of which FIG. 1 schematically shows the behaviour of the current of the solenoid in connection with the fuel injector nozzle as a function of time.

FIG. 2 shows a model 6 of the current signal of the solenoid as used in the invention. In the model, the changes of current 100 are modelled in a solenoid corresponding to a real one, but the current change caused by the movement of the plunger of the solenoid are ignored. The current signal is modelled for the time 110 it is desired to control the movement of the plunger, i.e. typically over the retraction time 1, and it rises from zero, corresponding to the activation moment of the solenoid, linearly to the level of the retraction current. Thus, there is no local maximum value of current caused by the beginning of the plunger of the solenoid to be seen in normal operation of the model. In case the time interval to be controlled is supposed to be retraction time 1, changes in current are modelled to the end of the retraction time 1. FIG. 2 also shows the measured current signal 7 of a working solenoid on the same time axis. This will clearly show the momentary decrease 7.1 of the current flowing through the solenoid during its retraction phase.

Figure 1:
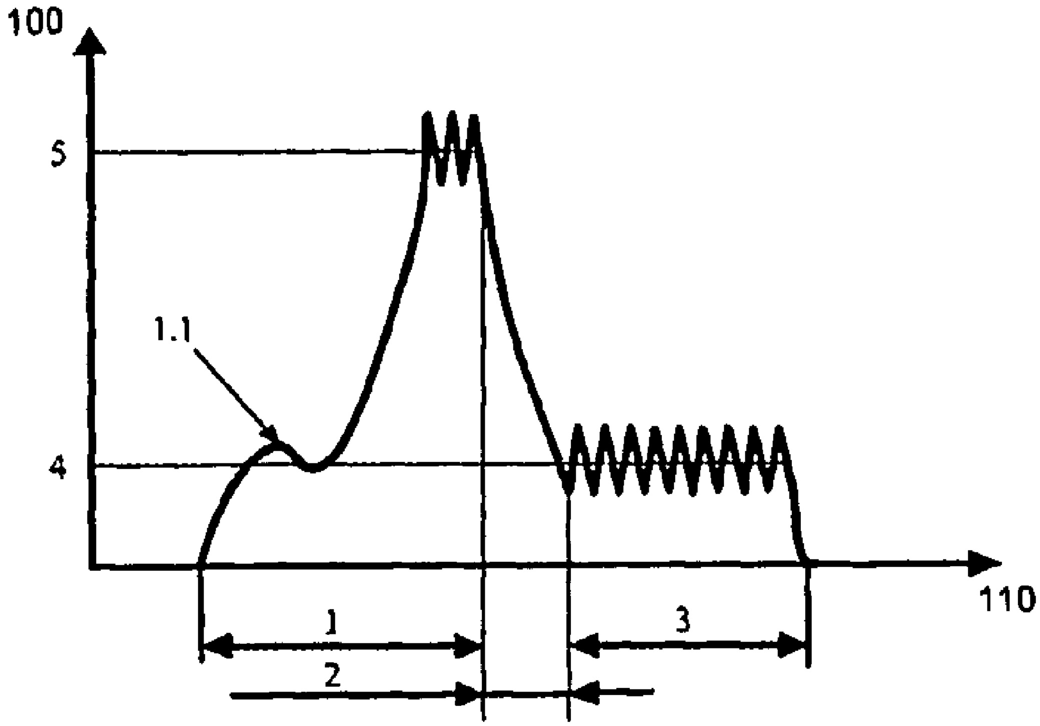
FIG. 1 schematically shows the behaviour of the current 100 of the solenoid when using the solenoid over a period of time 110, i.e. when a source of electric energy is connected thereto. Several stages, in different time phases, can be seen in the operation, starting from connecting the current. The first time phase 1 shows the so-called retraction time of the control, i.e. the time when the plunger of the solenoid is supposed to move from the rest position to operation position. The current flowing through the solenoid finally increases to its largest value, the so-called retraction current 5. The figure also shows that at a certain time subsequent to the activation the current decreases for a while, which causes a formation of local maximum value 1.1. This is due to the change of inductance caused by the beginning of the movement of the plunger, the change in turn causing a change in the electric current flowing through the solenoid. When the solenoid reaches its extreme position, the momentary reduction of current is stopped and the current can increase again. This situation is the opening moment of the injection valve. During the retraction of the solenoid the current reaches its extreme value, which is so-called retraction value. Subsequent to the retraction time 1 it is supposed that the plunger of the solenoid has reached its extreme position, whereby the value of the current decreases to a level that's sufficient to keep the plunger of the solenoid in its position. The decrease of the current also takes some time, also due to the influence of the inductance. This lower current level is called holding current 4. When the injection has lasted for a predetermined time 3, the energy source is disconnected from the solenoid, whereby the electric current disappears.
Figure 2:
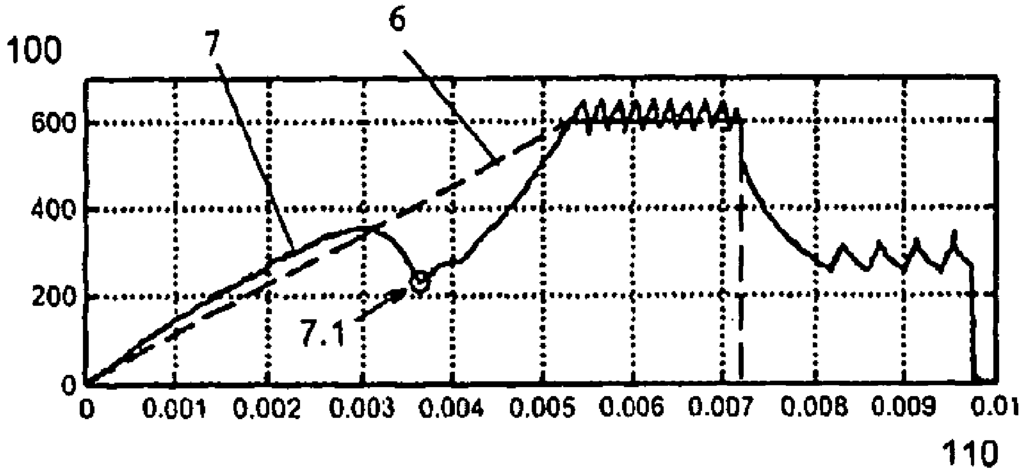
FIG. 2 shows a behaviour of the current of a solenoid in connection with a fuel injector nozzle as a function of time and the current signal of the model determined for the corresponding solenoid.
Figure 3:
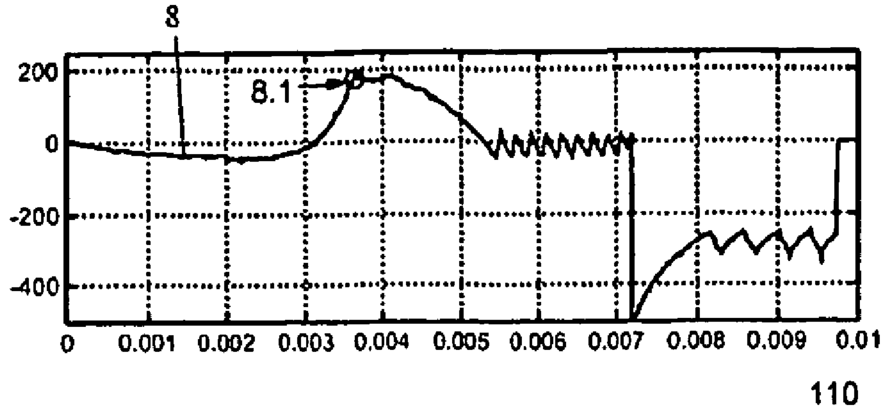
FIG. 3 shows the residual signal of the situation of FIG. 2.

Thus, this phenomenon has been found to be caused by the operation of the solenoid. When the method according to the invention is applied, the model 6 of the solenoid is stored in the control system as a simulated current value set. According to the invention, it is desirable to use a static measurement frequency, whereby the value of the model can be determined solely on the basis of the ordinal number of the measurement so, that each value of the model is the previous value with a certain constant number added, the constant number being determinable from the slope of the model 6. In the method, the remainder of the current signal 7 measured after the activation of the solenoid, i.e. after the opening sequence of the injector nozzle, and the current signal of the corresponding time of the model is determined as the residual signal 8. The residual signal 8 for the case of FIG. 2 is shown in FIG. 3. A threshold analysis 25 is performed for each residual signal determined thus for finding a positive value, i.e. a peak 8.1, exceeding the zero level. In the method, a certain limit value is determined for the peak that has to be exceeded before the movement of the plunger can be considered as started. The analysis is performed after each opening sequence of the valve and the model can be corrected on the basis of each measurement sequence, so that any changes in the apparatus can be considered.

Thus, in the valve opening recognition (VOR) according to the invention, the opening time of the injector nozzle can be determined be performing a threshold analysis for the residual value defined as described above.

Figure 4:
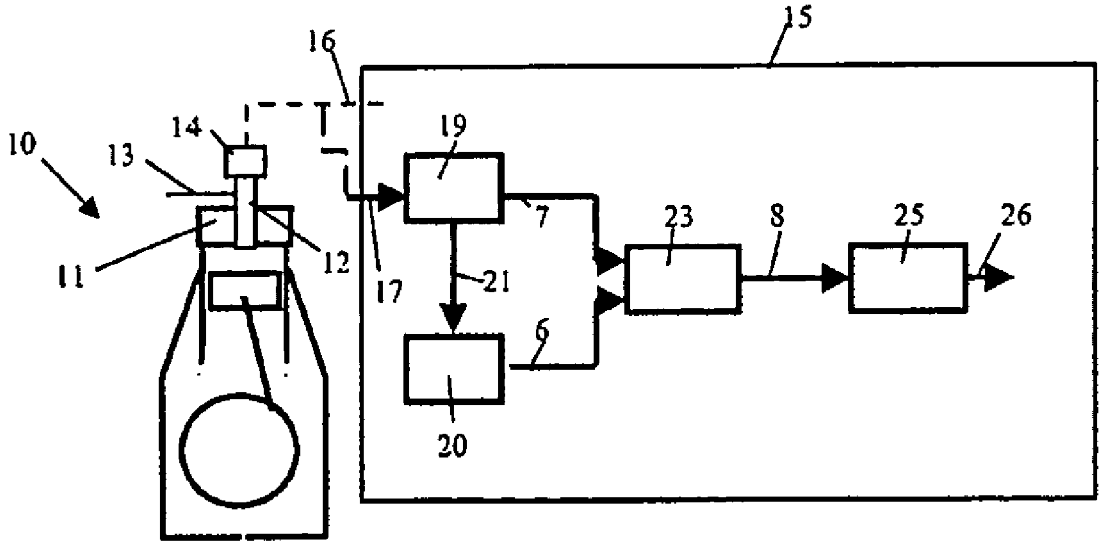
FIG. 4 is a schematic representation of a method according to the invention in a fuel injection system.

FIG. 4 schematically shows the parts of a fuel injection system of a piston engine 10 that are essential as far as the invention is concerned. The piston engine comprises an injector nozzle 12 arranged in the cylinder head 11. Fuel is transported to the injector nozzle 12 by means of a fuel channel 13. The operation of the injector nozzle is controlled by means of a solenoid 14. In this solution the solenoid is directly in connection with the fuel nozzle, but it can also operate indirectly, for example by controlling a separate control system, such as servo oil pressure. The operation of the engine as well as the fuel injection is controlled by means of an electronic control unit 15 arranged to perform various other engine control functions as well.

Thus, as the engine runs, the control unit controls, among others, fuel injection. Simply put, this happens by connecting the operation power on and off from the solenoid 14 controlling the operation of the injector nozzle. To accomplish this, the control unit 15 is in electrical connection 16 with the solenoid 14. According to the invention, the operation of the solenoid and especially the opening of the injector nozzle of the engine are controlled so that the current flowing through the solenoid is measured at certain intervals. As the opening sequence of the injector nozzle is relatively short in duration, it is obvious that the sampling frequency of the measurement values is chosen to be suitable for the situation. It is in addition important that the determination frequency of the model and the measured value correspond to each other. When the valve has opened, the measured signal set 7 is imported through a sample counter 19 into the residual signal computing unit 23. In addition to this, information about the ordinal number 21 of the measurement is imported into the model unit 20, into which the model being used is stored. This information is sufficient, because the method uses a static measurement frequency. The model signal 6 received from the model unit 20 on the basis of the point in time of the measurement is also imported into the residual signal computing unit 23. The residual signal computing unit now performs the subtraction of the values of the model signal 6 and the measured current signal 7, whereby the result is the residual signal 8. The residual signal 8 is imported into the threshold analysis unit 25, which performs a threshold analysis for the residual signal 8 by comparing it to the predetermined limit value, which is stored in the control unit 15. The point of time 21 that includes a positive increase can be considered the initial moment of the movement of the plunger of the solenoid, given that is has taken place within a certain time. If this is not the case, the plunger has not moved despite its control signal. The threshold analysis unit produces a signal 26 for the control system 15, the signal being capable of being used in the operation of the control system 15.

The invention is not limited to the embodiments described here, but a number of modifications thereof can be conceived of within the scope of the appended claims.

The invention claimed is:

1. A method for determining the beginning of movement of a plunger of a solenoid, in which solenoid the movement of the plunger is caused by bringing electric energy to the solenoid, whereby an electric current flows through the solenoid, characterized by the following steps:

defining a model for describing the current signal of the solenoid at certain time intervals from the activation moment of the solenoid onwards, the model value changing sequentially and linearly from zero value of the activation moment of the solenoid, measuring the true current signal of the solenoid at time intervals corresponding with the model, defining a residual signal, which is the remainder between the signal of the model and the true current signal, and performing a threshold analysis for the residual signal for determining a deviation of the residual signal from zero.

2. A method according to claim 1, wherein the time window for determining the model corresponds to the desired control time of the solenoid of the method, such as the retraction time.

3. A method according to claim 1, wherein in the threshold analysis the value of the residual signal is compared to a certain pre-determined limit value.

4. A method according to claim 1, wherein the solenoid controls the operation of the injector nozzle of the engine and that at least the point in time when the value of the residual signal exceeds the said limit value is forwarded further in the control unit to be used in the operation control of the engine.

5. A method according to claim 1, wherein the solenoid controls the operation of the injector nozzle of the engine and that the method is used for determining the beginning of the opening time of the injector nozzles.

6. A fuel injection system of an internal combustion engine, the system comprising at least one electrically controllable injector nozzle, characterized in that it is arranged to carry out the method according to claim 1.

* * * * *